United States Patent
Huang et al.

(10) Patent No.: US 8,062,933 B2
(45) Date of Patent: Nov. 22, 2011

(54) METHOD FOR FABRICATING HEAT DISSIPATING PACKAGE STRUCTURE

(75) Inventors: Chien-Ping Huang, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 435 days.

(21) Appl. No.: 11/954,355

(22) Filed: Dec. 12, 2007

(65) Prior Publication Data

US 2008/0090336 A1 Apr. 17, 2008

Related U.S. Application Data

(62) Division of application No. 11/232,612, filed on Sep. 21, 2005, now abandoned.

(30) Foreign Application Priority Data

Nov. 16, 2004 (TW) .............................. 93135022 A

(51) Int. Cl.
*H01L 33/64* (2010.01)
*H01L 33/48* (2010.01)

(52) U.S. Cl. ........ 438/122; 438/106; 438/108; 438/112; 438/118; 438/123; 438/458; 257/675; 257/706; 257/707; 257/720; 257/796; 257/E23.051; 257/E23.101

(58) Field of Classification Search ........ 438/FOR. 413, 438/106–108, 110–114, 118, 121–124, 458; 257/276, 625, 675, 706, 707, 712–722, 796, 257/E21.101, E33.075, E31.131, E23.051, 257/E23.08–E23.113
See application file for complete search history.

(56) References Cited

U.S. PATENT DOCUMENTS

| | | | |
|---|---|---|---|
| 5,726,079 A | 3/1998 | Johnson | |
| 6,232,152 B1 | 5/2001 | DiStefano et al. | |
| 6,232,652 B1 * | 5/2001 | Matsushima | 257/667 |
| 6,388,340 B2 | 5/2002 | Distefano | |
| 6,423,570 B1 | 7/2002 | Ma et al. | |
| 6,444,498 B1 | 9/2002 | Huang et al. | |
| 6,458,626 B1 * | 10/2002 | Huang et al. | 438/112 |
| 6,486,562 B1 * | 11/2002 | Kato | 257/778 |
| 6,552,267 B2 | 4/2003 | Tsao et al. | |
| 6,699,731 B2 * | 3/2004 | Huang et al. | 438/108 |
| 2002/0180035 A1 * | 12/2002 | Huang et al. | 257/706 |
| 2003/0155647 A1 * | 8/2003 | Lo et al. | 257/723 |
| 2006/0103014 A1 * | 5/2006 | Huang et al. | 257/712 |
| 2007/0029683 A1 * | 2/2007 | Tsai et al. | 257/796 |
| 2007/0141761 A1 * | 6/2007 | Lin et al. | 438/127 |
| 2010/0041181 A1 * | 2/2010 | Huang et al. | 438/113 |
| 2010/0151631 A1 * | 6/2010 | Pu et al. | 438/122 |

* cited by examiner

*Primary Examiner* — Matthew Landau
*Assistant Examiner* — Maliheh Malek
(74) *Attorney, Agent, or Firm* — Peter F. Corless; Steven M. Jensen; Edwards Wildman Palmer LLP

(57) ABSTRACT

A heat dissipating package structure includes a chip carrier; a semiconductor chip mounted and electrically connected to the chip carrier; an encapsulant formed on the chip carrier and for encapsulating the chip, with a non-active surface of the chip being exposed from the encapsulant; and a heat spreader having a hollow portion and attached to the encapsulant, wherein the chip is received in the hollow portion and the non-active surface of the chip is completely exposed to the hollow portion, such that heat generated by the chip can be directly dissipated out of the package structure. The present invention also provides a method for fabricating the heat dissipating package structure.

13 Claims, 13 Drawing Sheets

US 8,062,933 B2

METHOD FOR FABRICATING HEAT DISSIPATING PACKAGE STRUCTURE

CROSS-REFERENCE TO RELATED APPLICATION(S)

This application is a divisional of copending application U.S. Ser. No. 11/232,612, filed on Sept. 21, 2005.

FIELD OF THE INVENTION

The present invention relates to semiconductor packages and methods for fabricating the same, and more particularly, to a ball grid array (BGA) package structure with a heat spreader and a method for fabricating the BGA package structure.

BACKGROUND OF THE INVENTION

Ball Grid Array (BGA) packaging technology, which is a well-known advanced technology in the relevant art, is performed in a manner as to mount a semiconductor chip on a front side of a substrate and implant a grid array of solder balls on a back side of the substrate. The solder balls are used to electrically connect the entire package unit to an external printed circuit board. The BGA packaging technology advantageously incorporates more I/O (input/output) connections within the same unit area of a chip carrier (e.g. the substrate) such that the high integration requirement of the semiconductor chip is satisfied.

The highly integrated semiconductor chip during operation usually produces a large amount of heat. As the semiconductor chip is encapsulated by an encapsulant that is made of a resin material having poor thermal conductivity (a coefficient of thermal conductivity thereof is only 0.8 w/m-k), the heat produced from the semiconductor chip cannot be effectively dissipated through the encapsulant. This results in unsatisfactory heat dissipating efficiency and adversely affects the performance and lifetime of the semiconductor chip.

Accordingly, a thermally enhanced BGA semiconductor package incorporated with a heat dissipating structure has been proposed in order to improve the heat dissipating efficiency of the semiconductor package.

As shown in FIG. 1 for a semiconductor package 1 disclosed by U.S. Pat. No. 5,726,079, there is a heat spreader 11 directly attached to a chip 10 wherein a top surface 11a of the heat spreader 11 is exposed to the atmosphere from an encapsulant 12 that encapsulates the chip 10, such that heat generated by the chip 10 can be transferred to the heat spreader 11 and dissipated to the atmosphere without having to pass through the encapsulant 12 that has poor thermal conductivity.

However, the semiconductor package 1 causes significant drawbacks during fabrication thereof. After the heat spreader 11 is attached to the chip 10, the structure of combined heat spreader 11 and chip 10 is placed into a mold cavity of an encapsulation mold (not shown) to perform a molding process for forming the encapsulant 12. As the top surface 11a of the heat spreader 11 is intended being exposed, the top surface 11a must abut against a top wall of the mold cavity during molding. However, if the top surface 11a of the heat spreader 11 fails to effectively abut against the top wall of the mold cavity, resin flashes of the encapsulant 12 are formed on the top surface 11a of the heat spreader 11, which not only deteriorate the heat dissipating efficiency but also impair appearance of the fabricated product. In such case, an additional deflashing process is usually required to remove the flashes, which undesirably prolongs the fabrication time, increases fabrication costs, and possibly damages the fabricated product. On the other hand, too close contact between the heat spreader 11 and the top wall of the mold cavity may lead to cracking of the fragile chip 10 by excessive pressure from the encapsulation mold.

In particular, if a distance between the top surface 11a of the heat spreader 11 and an upper surface of a substrate 13 where the chip 10 is mounted is larger than a depth of the mold cavity, during the molding process, the heat spreader 11 is pressed by the upper mold and thus the chip 10 directly in contact with the heat spreader 11 is cracked. On the contrary, if the distance between the top surface 11a of the heat spreader 11 and the upper surface of the substrate 13 is smaller than the depth of the mold cavity, resin flashes of the encapsulant 12 are formed on the top surface 11a of the heat spreader 11 during molding, which undesirably decrease an exposed area of the top surface 11a of the heat spreader 11 and reduce the heat dissipating efficiency.

To make the distance between the top surface 11a of the heat spreader 11 and the upper surface of the substrate 13 equal to the depth of the mold cavity, attachment between the chip 10 and the heat spreader 11, attachment between the chip 10 and the substrate 13, and the thickness of the heat spreader 11 must be precisely performed and controlled, such that the packaging costs and process complexity in fabrication are increased. Further by such requirement on precision, the heat spreader 11 can only be attached to the chip 10 one by one rather than a batch-type method, thereby increasing the fabrication time and reducing the packaging efficiency.

Since the heat dissipating efficiency of the semiconductor package 1 is proportional to the exposed area of the top surface 11a of the heat spreader 11, the heat spreader 11 when having the same surface area as the semiconductor package 1 would have the maximum exposed area to provide the maximum heat dissipating efficiency under a condition with a constant size of the semiconductor package 1. To achieve this arrangement, sides of the heat spreader should be flush or engaged with side walls of the mold cavity during the molding process. However, if the heat spreader is inaccurately fabricated and oversized, it cannot be successfully placed into the mold cavity; or, if the heat spreader is undersized, resin flashes of the encapsulant may easily occur on the top surface or sides of the heat spreader. Therefore, such structural arrangement causes a yield concern and difficulty in fabrication.

In view of the foregoing drawbacks, U.S. Pat. Nos. 6,458,626 and 6,444,498 disclose a semiconductor package with a heat spreader being directly attached to a chip without causing chip cracking or resin flashes on an exposed surface of the heat spreader, as shown in FIGS. 2A to 2C and FIG. 3. In this semiconductor package, an interface layer 25 is formed on a surface of a heat spreader 21 to be exposed to the atmosphere, and has poor adhesion with an encapsulant 24 or the heat spreader 21. Then, the heat spreader 21 is directly attached to a chip 20 mounted on a substrate 23. A molding process is performed to form the encapsulant 24 for encapsulating the heat spreader 21, the chip 20 and the interface layer 25 on the heat spreader 21 (as shown in FIG. 2A). The depth of a mold cavity of an encapsulation mold used in the molding process is made larger than the sum of the chip 20 and the heat spreader 2 in thickness, such that the encapsulation mold does not come into contact with and press the heat spreader 21 and the chip 20 is not cracked during molding. Subsequently, a singulation process is performed (as shown in FIG. 2B), and the encapsulant 24 above the heat spreader 21 is removed. If the adhesion between the heat spreader 21 and the interface layer 25 (such as a plated gold layer) is larger than that between the interface layer 25 and the encapsulant 24, the interface layer 25 remains on the heat spreader 21 after the encapsulant 24 above the heat spreader 21 is removed, and no residue of the encapsulant 24 is left on the heat spreader 21 (as shown in FIG. 2C), thereby no flash problem. On the contrary, if the adhesion between the interface layer 25 (such as an adhesive tape made of polyimide resin) and the heat spreader 21 is smaller than that between the interface layer 25 and the encapsulant 24, the interface layer 25 is removed together with removal of the encapsulant 24 above the heat spreader 21 (as shown in FIG. 3), such that no flash of the encapsulant 24 occurs on the heat spreader 21.

An adhesive layer 26 is applied between the chip 20 and the heat spreader 21 to effectively attach the heat spreader 21 to the chip 20. The adhesive layer 26 is usually made of a thermal grease for attaching the heat spreader 21 to the chip 20 in order to improve heat dissipating performance of the chip 20. However, a coefficient of thermal conductivity of the thermal grease is about 3 w/m-k, which is larger than that of the encapsulant (about 0.8 w/m-k) but much smaller than that of the heat spreader made of copper (about 400 w/m-k). Therefore, heat generated during operation of the chip is still transferred through the less thermally conductive thermal grease to the heat spreader and then dissipated to the atmosphere, which is disadvantageous for heat dissipation.

As shown in FIGS. 4A to 4C, U.S. Pat. No. 6,699,731 provides a semiconductor package with exposed chip, wherein a chip 40 is mounted on a substrate 43 and a module plate 41 is attached to the chip 40 via a tape 42. A molding process is performed to form an encapsulant 44 for encapsulating the module plate 41 and the chip 40 (as shown in FIG. 4A). Then, a singulation process is carried out (as shown in FIG. 4B), and the tape 42, the module plate 41 and the encapsulant 44 above the chip 40 are removed to form the semiconductor package with exposed chip. This allows heat generated during operation of the chip 40 to be directly dissipated to the atmosphere.

However, when the tape 42 is removed from the chip 40, residues of an adhesive material of the tape 42 may easily remain on the encapsulant 44, which not only impair appearance of the fabricated product but also require an additional cleaning process, thereby making the overall packaging processes complicated and increasing the fabrication costs.

Therefore, the problem to be solved here is to provide a heat dissipating package structure and a method for fabricating the same, which can overcome the foregoing drawbacks.

SUMMARY OF THE INVENTION

In view of the foregoing drawbacks in the conventional technology, an objective of the present invention is to provide a heat dissipating package structure and a method for fabricating the same, wherein a heat spreader is mounted to a chip to improve the heat dissipating efficiency, and problems of chip cracking and resin flashes during a molding process are avoided so as to improve the yields of fabricated products.

Another objective of the present invention is to provide a heat dissipating package structure and a method for fabricating the same, wherein a non-active surface of a chip is completely exposed so as to improve the heat dissipating efficiency. Still another objective of the present invention is to provide a heat dissipating package structure and a method for fabricating the same, whereby the heat dissipating efficiency is not affected by an adhesive material applied between a chip and a heat spreader.

A further objective of the present invention is to provide a heat dissipating package structure and a method for fabricating the same, which can avoid residues of an adhesive material from being left on a surface of the package structure, thereby not impairing appearance of the package structure and not requiring an additional residue-removing process or additional costs.

A further objective of the present invention is to provide a heat dissipating package structure and a method for fabricating the same, whereby semiconductor packages integrated with heat spreaders and chips can be fabricated in a batch-type manner, so as to simplify the fabrication processes, reduce the packaging time, and decrease the fabrication costs.

A further objective of the present invention is to provide a heat dissipating package structure and a method for fabricating the same, whereby a process of mounting a heat spreader to a chip is performed without a concern of height control, thereby reducing the packaging costs and improving the yields. In accordance with the above and other objectives, the present invention proposes a method for fabricating a heat dissipating package structure, comprising the steps of: mounting a semiconductor chip on a chip carrier and electrically connecting an active surface of the semiconductor chip to the chip carrier; preparing a heat spreader attached to an interface layer, the heat spreader having a hollow portion corresponding in position to the chip, and mounting the heat spreader to a non-active surface of the chip via the interface layer, with the chip being received in the hollow portion of the heat spreader; performing a molding process to form an encapsulant for completely encapsulating the chip on the chip carrier and the heat spreader with the interface layer; and performing a singulation process to remove peripheral non-electrical functional portions of a package unit obtained after the molding process such that sides of the heat spreader are exposed, and removing the interface layer and a part of the encapsulant formed on the interface layer so as to expose the heat spreader and completely expose the non-active surface of the chip to the hollow portion of the heat spreader. Further, a heat dissipating structure can be mounted on the heat spreader via a thermally conductive adhesive layer and is extended to reach the non-active surface of the chip exposed to the hollow portion of the heat spreader, such that heat generated by the chip during operation can be dissipated via the heat dissipating structure. The chip is smaller in size than the hollow portion of the heat spreader, such that the chip can be received in the hollow portion.

In the above fabrication method, the chip carrier can be a substrate or a lead frame, and the chip can be electrically connected to the chip carrier by a flip-chip or wire-bonding technique. The heat dissipating package structure can be fabricated in a batch-type manner that a plurality of semiconductor chips are mounted on a matrix-type chip carrier module plate, and after mounting a heat spreader with an interface layer to the chips and performing a molding process, a plurality of semiconductor packages integrated with heat spreaders are obtained by a singulation process, thereby favorable for mass production.

The present invention also proposes a heat dissipating package structure, comprising a chip carrier; a semiconductor chip having an active surface and a corresponding non-active surface, wherein the active surface of the chip is mounted and electrically connected to the chip carrier; an encapsulant formed on the chip carrier and for encapsulating the chip, with the non-active surface of the chip being exposed from the encapsulant; and a heat spreader having a hollow portion and attached to the encapsulant, such that the chip is received in the hollow portion of the heat spreader and the non-active surface of the chip is completely exposed to the hollow portion. The hollow portion of the heat spreader can have a flexible shape as long as the chip can be received therein. A surface of the heat spreader in contact with the encapsulant can be made uneven or subjected to a black oxidation treatment, so as to reinforce bonding between the heat spreader and the encapsulant.

In a preferred embodiment of the present invention, the chip carrier is a ball grid array (BGA) substrate, wherein at least one opening is formed through the substrate such that the chip is electrically connected to the substrate by bonding wires passing through the opening. A plurality of solder balls are implanted on a surface of the substrate not mounted with the chip, and are used to electrically connect the chip to an external device.

In another preferred embodiment of the present invention, the chip carrier is a flip-chip substrate, wherein a plurality of array-arranged bond pads are formed on an upper surface of the substrate such that the chip is electrically connected to the substrate by a plurality of conductive bumps bonded to the bond pads. A plurality of solder balls are implanted on a lower surface of the substrate, for electrically connecting the chip to an external device.

In a further preferred embodiment of the present invention, the chip carrier is a QFN (quad flat non-leaded) lead frame. The chip is mounted and electrically connected to leads of the QFN lead frame in a flip-chip manner, such that the chip can subsequently be electrically connected to an external device via the leads. It should be noted that in the heat dissipating package structure and the method for fabricating the same according to the present invention, the selection of chip carrier and the manner of electrical connection between semiconductor chip and chip carrier can be flexibly combined and modified without departing from the scope of the present invention, and all the combinations and modifications are encompassed by the present invention.

Therefore, by the heat dissipating package structure and the method for fabricating the same in the present invention, an active surface of a semiconductor chip is mounted and electrically connected to a chip carrier, and a heat spreader having a hollow portion and attached to an interface layer is prepared wherein the interface layer seals one end of the hollow portion of the heat spreader, such that the heat spreader is mounted to a non-active surface of the chip via the interface layer, and the chip smaller in size than the hollow portion of the heat spreader is received in the hollow portion, allowing the non-active surface of the chip to be completely exposed to the hollow portion. By this arrangement, thermal resistance from an adhesive layer applied between a chip and a heat spreader as in the conventional technology is avoided. In the present invention, the chip may directly come into contact with the atmosphere to improve the heat dissipating efficiency. A molding process is then performed to form an encapsulant for completely encapsulating the chip on the chip carrier and the heat spreader with the interface layer. A singulation process is carried out to remove peripheral non-electrical functional portions of a package unit obtained after the molding process. Subsequently, a part of the encapsulant formed on the heat spreader is removed. As the interface layer has larger adhesion with the encapsulant than with the heat spreader or the non-active surface of the chip, the interface layer can be removed together with removal of the part of the encapsulant on the interface layer, without leaving any residue of the interface layer on the heat spreader and the non-active surface of the chip. Therefore, the heat spreader is exposed directly and the non-active surface of the chip is exposed to the hollow portion of the heat spreader, such that the heat dissipating efficiency is improved. Moreover, the present invention can be accomplished by a batch-type manner, which desirably simplifies the fabrication processes, reduces the packaging time and costs, prevents chip cracking or resin flashes in the molding process and impaired appearance of fabricated products or increase in deflashing costs, and has no concern for height control during the process of mounting the heat spreader to the chip. As such, packaging costs are reduced and yields are improved in the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

FIGS. 5A to 5G are cross-sectional views showing steps of a method for fabricating a heat dissipating package structure according to a first preferred embodiment of the present invention.

Figure 1:
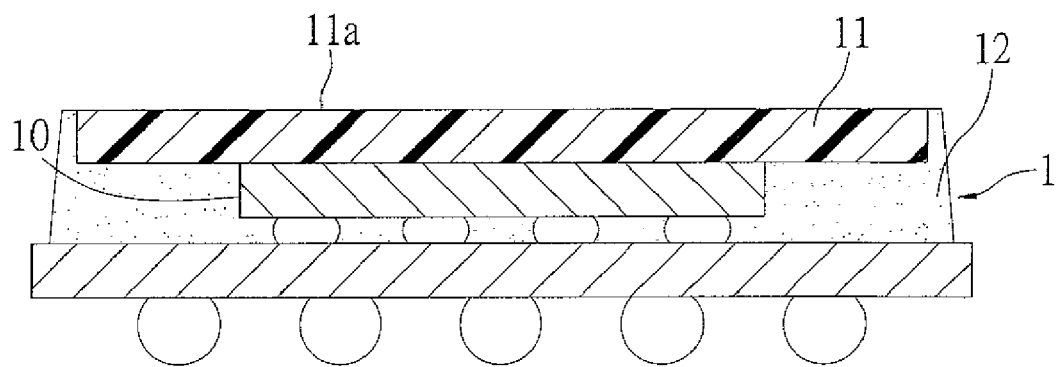
FIG. 1 (PRIOR ART) is a cross-sectional view showing a semiconductor package according to U.S. Pat. No. 5,726,079.
Figure 2A:
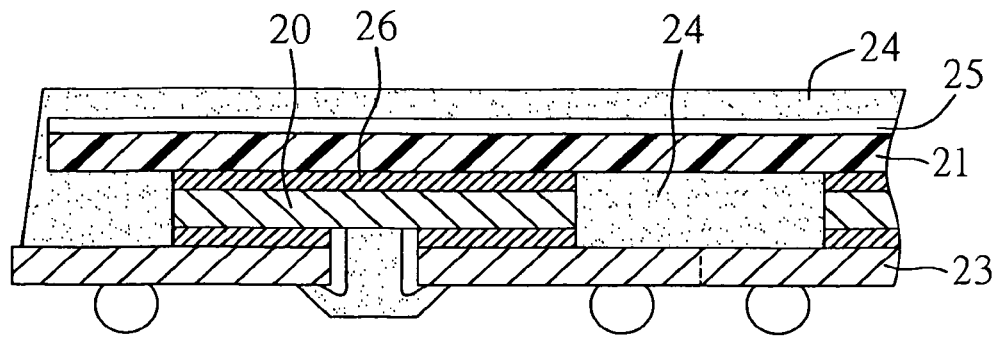
FIGS. 2A to 2C (PRIOR ART) are cross-sectional views showing steps for fabricating a semiconductor package according to U.S. Pat. No. 6,458,626.
Figure 2B:
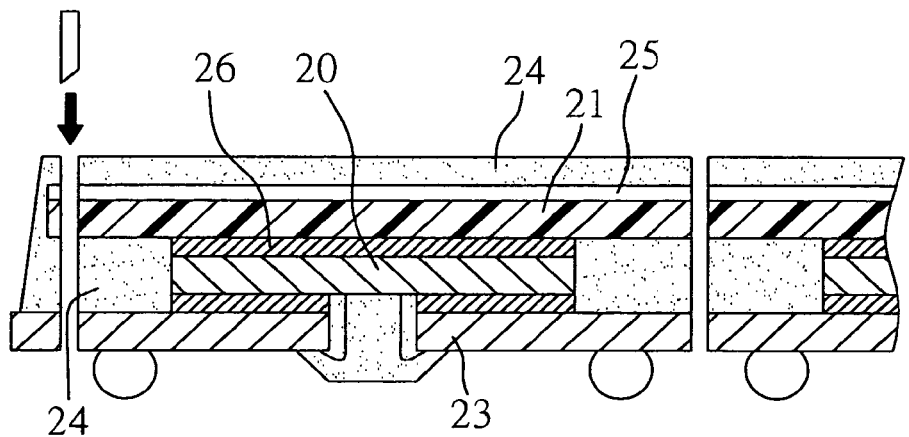
Figure 2C:
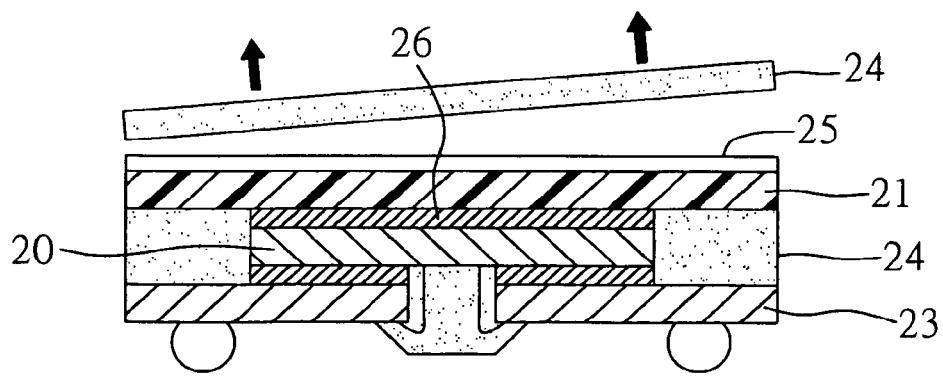
Figure 3:
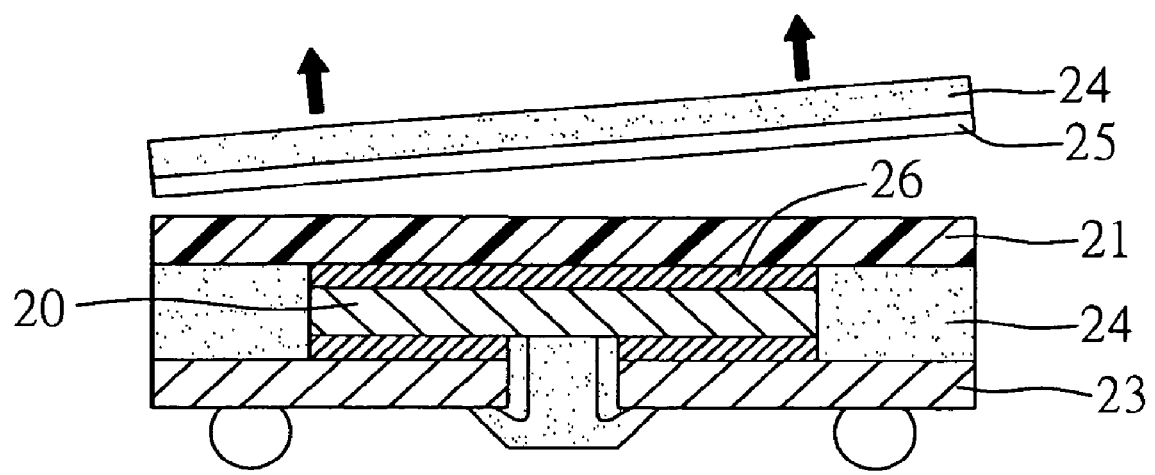
FIG. 3 (PRIOR ART) is a cross-sectional view showing a semiconductor package according to U.S. Pat. No. 6,444,498.
Figure 4A:
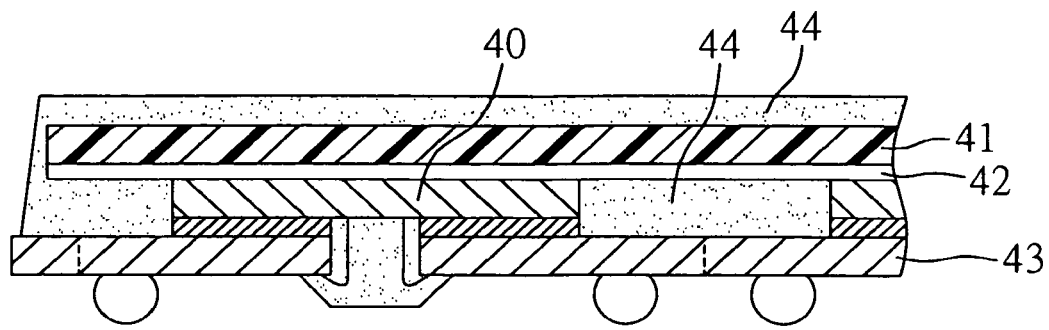
FIGS. 4A to 4C (PRIOR ART) are cross-sectional views showing steps for fabricating a semiconductor package according to U.S. Pat. No. 6,699,731.
Figure 4B:
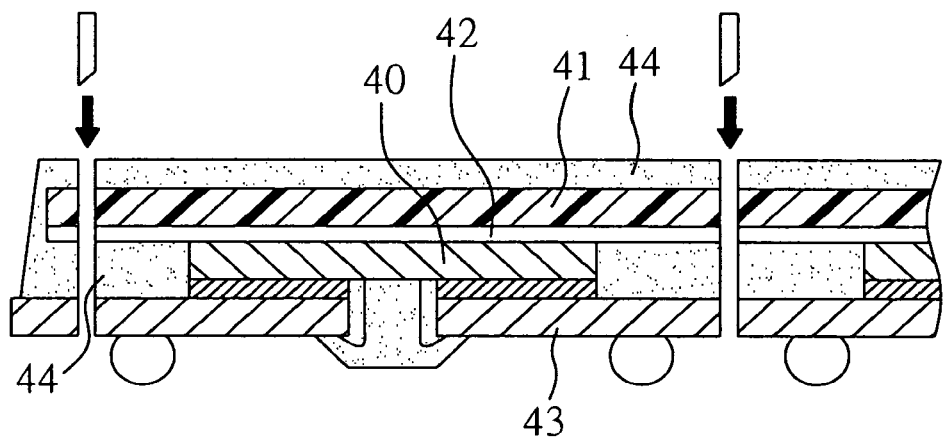
Figure 4C:
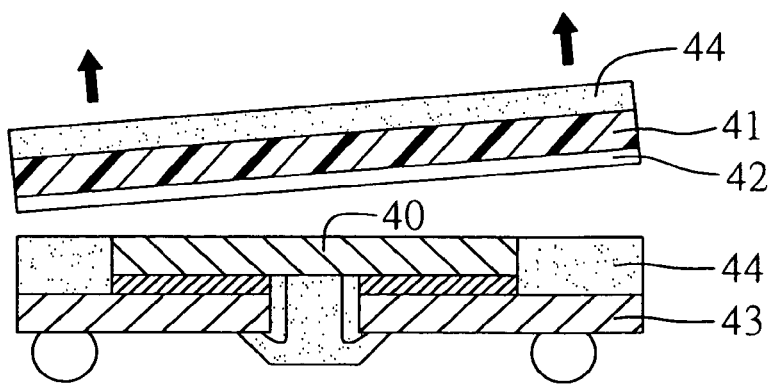
Figure 5A:
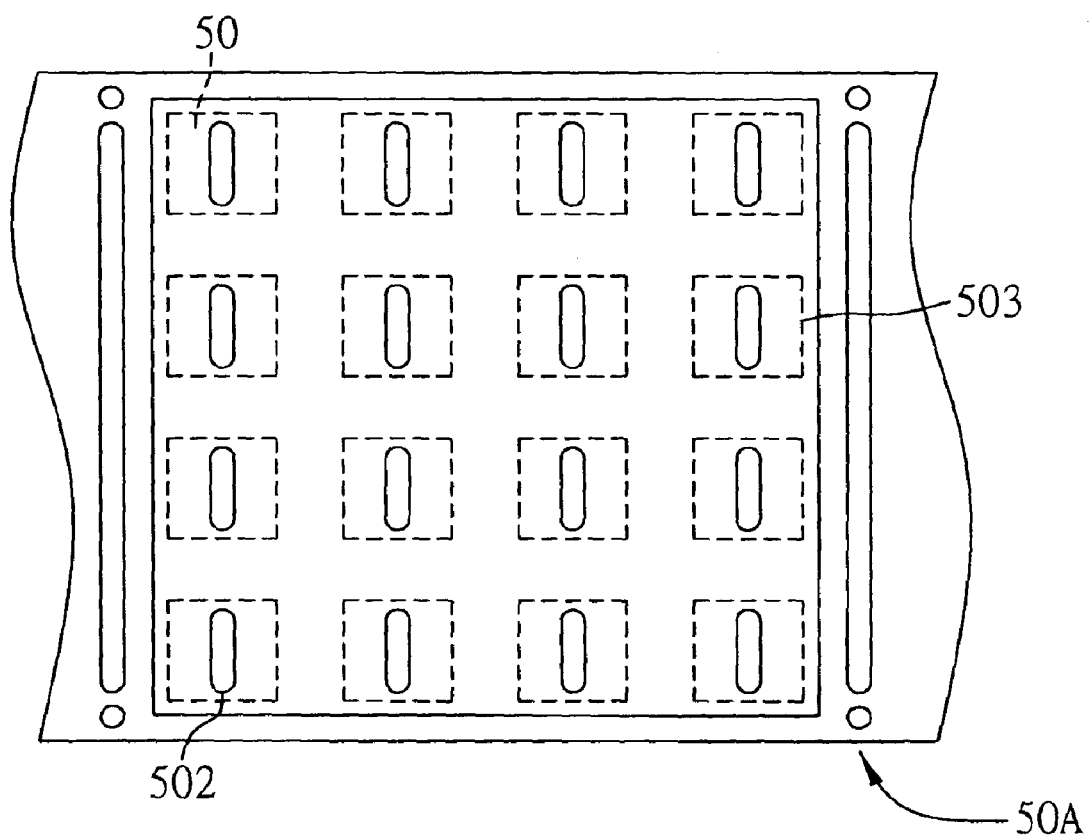
FIGS. 5A to 5G are cross-sectional views showing steps of a method for fabricating a heat dissipating package structure according to a first preferred embodiment of the present invention.

Referring to FIG. 5A, a matrix-type chip carrier module plate such as a matrix-type substrate module plate 50A is provided, which comprises a plurality of array-arranged substrates 50. Each of the substrates 50 has an upper surface 500, a lower surface 501, and an opening 502 penetrating therethrough. It should be noted that, besides being array-arranged, the substrates can also be arranged in a strip, or single substrates may also be used under suitable fabrication conditions.

Figure 5B:
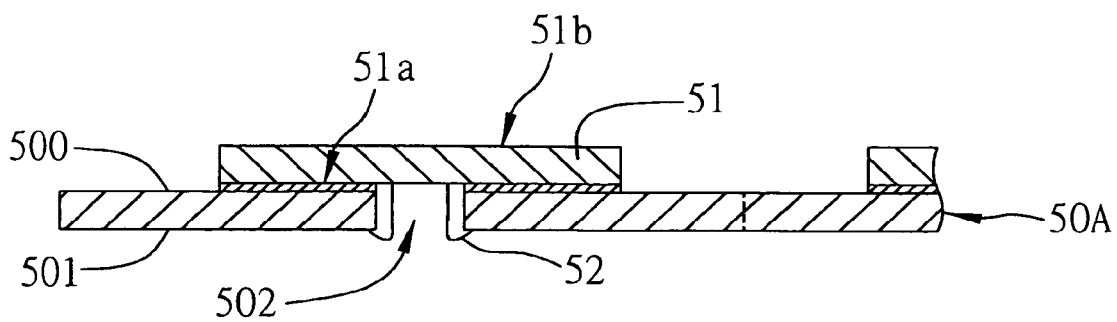
Figure 5C:
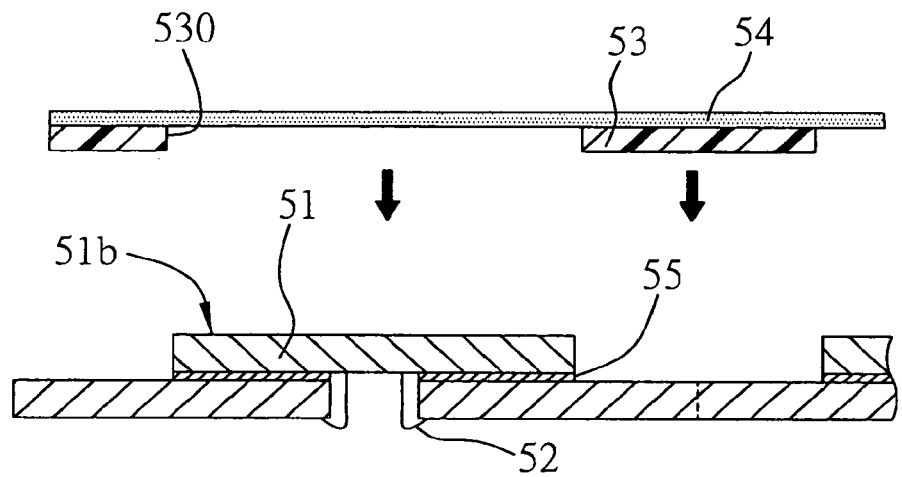

Referring to FIG. 5B, an active surface 51a of a semiconductor chip 51 is mounted at a predetermined position on the upper surface 500 of each of the substrates 50 by an adhesive layer 55 such as silver paste, allowing the chip 51 to seal one end of the opening 502. A plurality of bonding wires such as gold wires 52 passing through the opening 502 are bonded to the active surface 51a of the chip 51 and the lower surface 501 of each of the substrates 50, such that the chip 51 is electrically connected to the substrate 50 via the gold wires 52. The wire-bonding process is well known in the art and thus not to be further described herein. Referring to FIG. 5C, a heat spreader 53 having a hollow portion 530 is attached to an interface layer 54 such as a tape. The hollow portion 530 of the heat spreader 53 corresponds in position to the chip 51 and is larger in size than the chip 51. The heat spreader 53 with the interface layer 54 is mounted to a non-active surface 51b of the chip 51 via the interface layer 54, and the chip 51 is received in the hollow portion 530, such that the non-active surface 51b of the chip 51 can subsequently be completely exposed to the hollow portion 530. Thereby, thermal resistance from an adhesive layer applied between a chip and a heat spreader as in the conventional technology is avoided, and subsequently the chip 51 can directly come into contact with the atmosphere to improve the heat dissipating efficiency.

The heat spreader 53 can be made of a metallic material such as copper, aluminum, copper alloy or aluminum alloy, etc., and the hollow portion 530 thereof can have a flexible shape as long as the chip 51 can be received therein. The heat spreader 53 should have a size sufficient to completely cover the substrates 50 mounted with the chips 51. In other words, peripheral edges of the heat spreader 53 should be extended out of peripheral sides 503 of the substrates 50 (as indicated by dotted lines shown in FIG. 5A).

The interface layer 54 can be made of a polyimide (P.I.) tape, a metallic material film (such as copper, aluminum), a highly thermal resistant organic material film (such as FR4, BT), or a highly thermal resistant paper film. Adhesion between the interface layer 54 and an encapsulant for encapsulating the chip 51 should be larger than that between the interface layer 54 and the heat spreader 53 or the non-active surface 51b of the chip 51, and the adhesion between the interface layer 54 and the heat spreader 53 is smaller than that between the heat spreader 53 and the encapsulant 57.

Figure 5D:
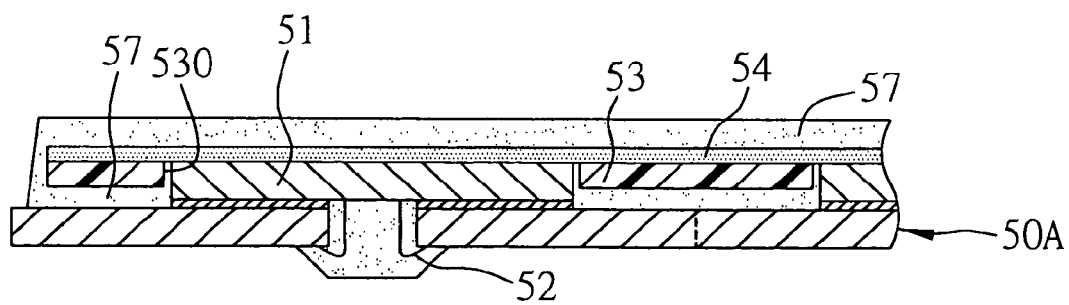
Figure 5E:
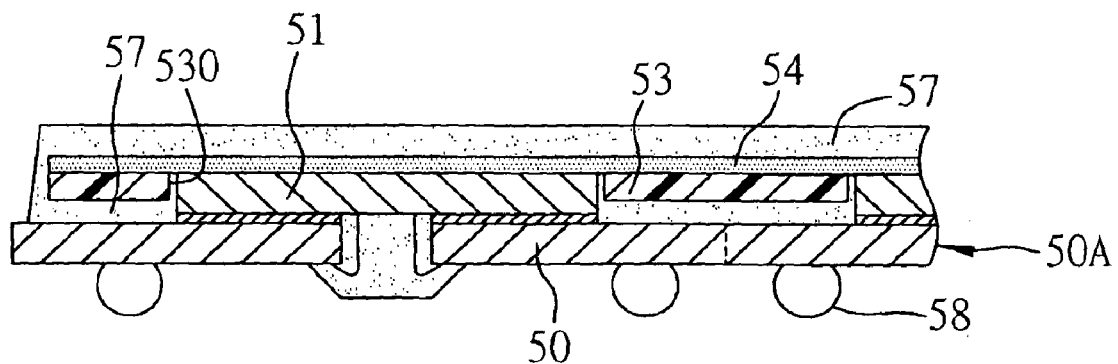

Referring to FIG. 5D, a combined structure of the interface layer 54, the heat spreader 53 having the hollow portion 530, the chips 51 and the substrate module plate 50A is placed into a mold cavity of an encapsulation mold (not shown) to perform a molding process, such that an encapsulant 57 is fabricated for encapsulating the heat spreader 53 with the interface layer 54, the chips 51 and the gold wires 52. As the combined structure has a height allowing an appropriate distance to be formed between the interface layer 54 on the heat spreader 53 and a top wall of the mold cavity, the chip 51 is not pressed or cracked by the encapsulation mold or the heat spreader 53 after engagement of the encapsulation mold, and there is no need to have accurate control in height for mounting the heat spreader 53 to the chip 51, thereby effectively improving the yields and reliability of fabricated products. Referring to FIG. 5E, a plurality of conductive elements such as solder balls 58 are implanted on the lower surface 501 of each of the substrates 50 of the substrate module plate 50A, such that the chip 51 can be electrically connected to an external device by the solder balls 58. The ball-implanting process is well known in the art and thus not to be further described herein. Alternatively, the conductive elements such as the solder balls 58 can be implanted after completing a subsequent singulation process of the substrates.

Figure 5F:
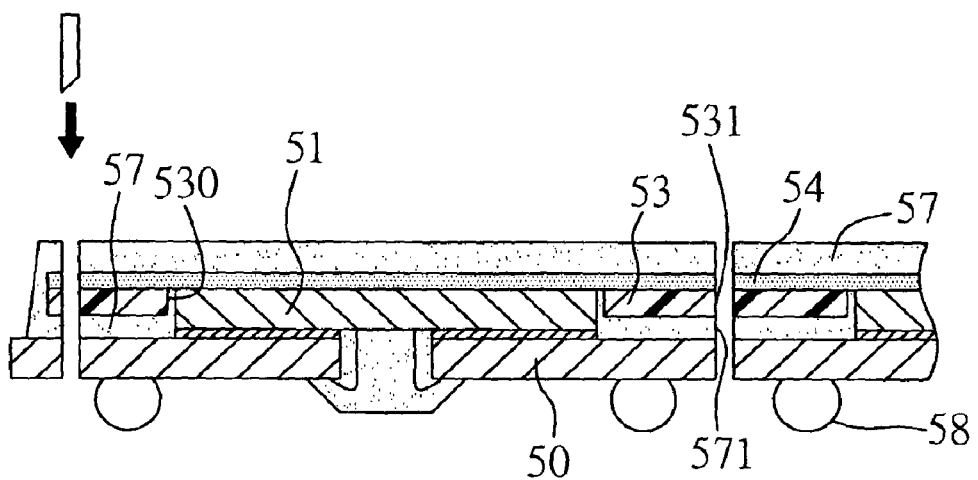

Referring to FIG. 5F, the singulation process is performed using a jig (not shown) to adsorb in vacuum the encapsulant 57 formed on the interface layer 54 of the semi-fabricated product obtained after the ball-implanting process, such that the semi-fabricated product can be adsorbed on the jig during or after the singulation process. As the encapsulant 57 formed on the interface layer 54 is attached to the heat spreader 53 via the interface layer 54, the encapsulant 57 is not detached from the rest part of the semi-fabricated product when performing the singulation process. The singulation process is carried out to remove peripheral non-electrical functional portions of package units obtained after the molding process to form individual package units. After singulation, sides 531 of the heat spreader 53 are exposed from the encapsulant 57 and are flush with sides 571 of the encapsulant 57, such that no flash occurs on the sides 531 of the heat spreader 53, and the heat spreader 53 has the same area as that of the substrate 50, without having to precisely size the heat spreader 53 to correspond to a size of the mold cavity of the encapsulation mold. Moreover, the process of mounting the heat spreader 53 to the chip 51 is performed in a batch-type manner, thereby simplifying the fabrication processes and reducing the fabrication time and costs.

Figure 5G:
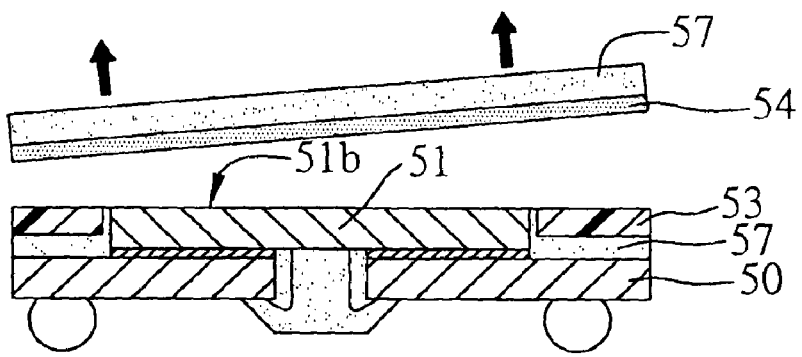

Referring to FIG. 5G, the interface layer 54 and a part of the encapsulant 57 formed thereon are removed from the semi-fabricated product obtained after the singulation process. Since the adhesion between the interface layer 54 and the heat spreader 53 or the non-active surface 51b of the chip 51 is smaller than that between the interface layer 54 and the encapsulant 57 formed thereon, the interface layer 54 can be removed from the heat spreader 53 together with removal of the encapsulant 57 formed on the interface layer 54. Moreover, since the adhesion between the heat spreader 53 and the encapsulant 57 is larger than that between the interface layer 54 and the heat spreader 53, attachment between the heat spreader 53 and the encapsulant 57 is not affected and no residue of the interface layer 54 is left on the heat spreader 53 and the encapsulant 57 when the interface layer 54 is removed from the heat spreader 53. Thereby, the heat spreader 53 can be exposed from the encapsulant 57 to directly come into contact the atmosphere, and the non-active surface 51b of the chip 51 can be completely exposed to the hollow portion 530 of the heat spreader 53, such that thermal resistance from an adhesive layer applied between a chip and a heat spreader as in the conventional technology is avoided and the chip 51 can directly come into contact with the atmosphere to improve the heat dissipating efficiency. Further, there is no need to perform any post treatment for deflashing and residue removal, thereby reducing the packaging costs and ensuring good appearance of fabricated semiconductor packages. As the chip 51 is received in the hollow portion 530 of the heat spreader 53, the package structure can further be made more compact in profile.

Figure 6A:
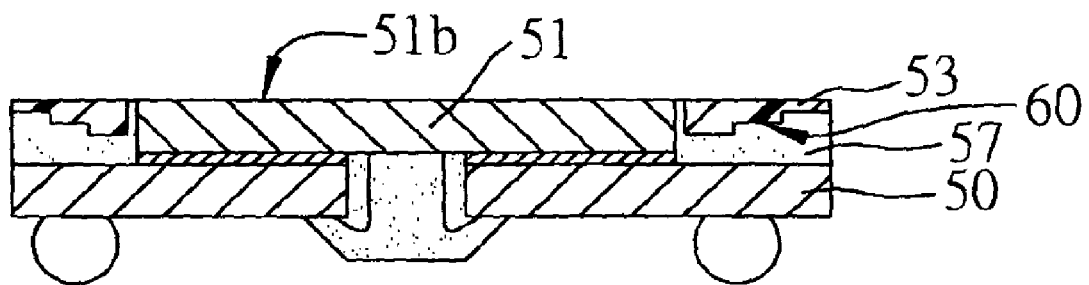
FIG. 6A is a cross-sectional view showing the heat dissipating package structure with enhanced bonding between a heat spreader and an encapsulant according to the first preferred embodiment of the present invention.
Figure 6B:
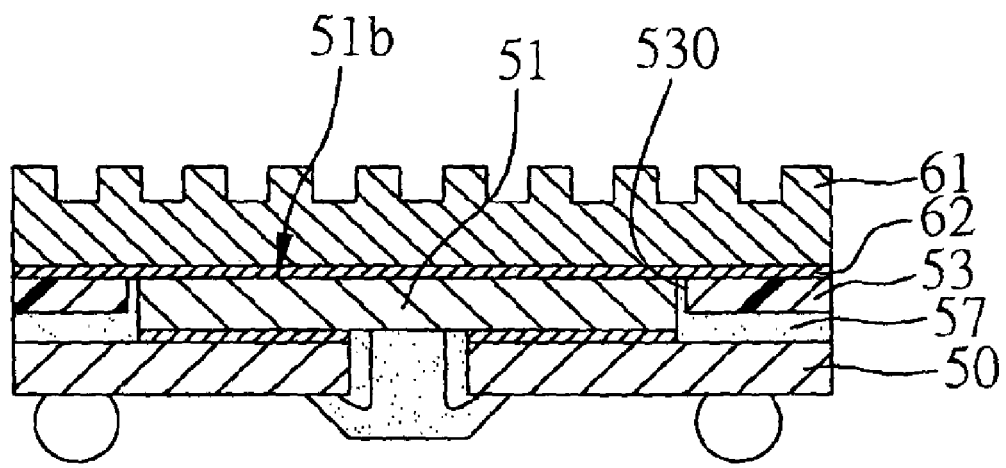
FIG. 6B is a cross-sectional view showing a heat dissipating structure being provided on the heat spreader in the heat dissipating package structure according to the first preferred embodiment of the present invention.

Referring to FIG. 6A, in order to reinforce bonding between the heat spreader 53 and the encapsulant 57, a surface 60 of the heat spreader 53 in contact with the encapsulant 57 can be made uneven or subjected to a black oxidation treatment. Moreover, a heat dissipating structure 61 (as shown in FIG. 6B) can be attached to the heat spreader 53 via a thermally conductive adhesive layer 62 and is extended to reach the non-active surface 51b of the chip 51 exposed to the hollow portion 530 of the heat spreader 53, such that heat generated by the chip 51 during operation can be dissipated by the heat dissipating structure 61.

Second Preferred Embodiment

FIGS. 7A to 7G are cross-sectional views showing steps of a method for fabricating a heat dissipating package structure according to a second preferred embodiment of the present invention. The fabrication method of the second embodiment is substantially the same as that of the first embodiment, with a primary difference in that a semiconductor chip is electrically connected to a substrate in a flip-chip manner in the second embodiment.

Figure 7A:
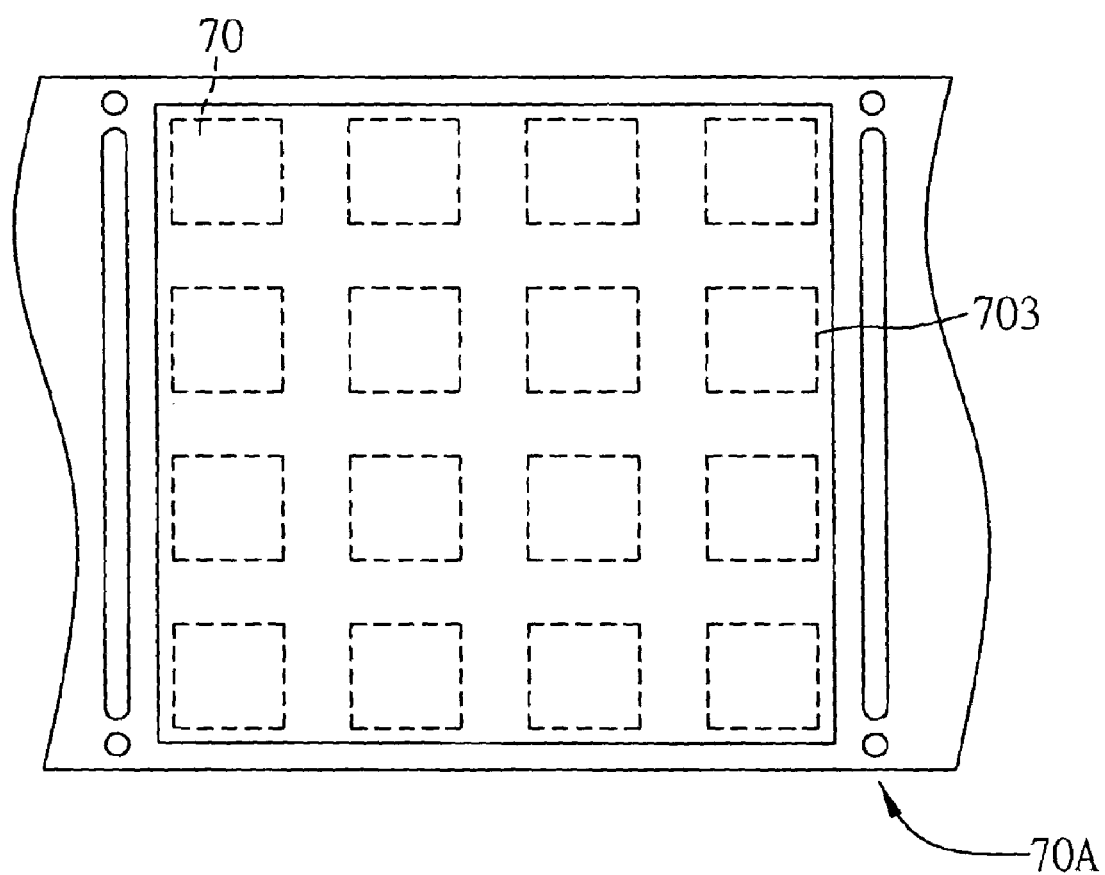
FIGS. 7A to 7G are cross-sectional views showing steps of a method for fabricating a heat dissipating package structure according to a second preferred embodiment of the present invention.

Referring to FIG. 7A, a matrix-type substrate module plate 70A is provided, which comprises a plurality of array-arranged substrates 70. Each of the substrates 70 has an upper surface 700 and a lower surface 701. It should be noted that, besides being array-arranged, the substrates can also be arranged in a strip, or single substrates can also be used under suitable fabrication conditions.

Figure 7B:
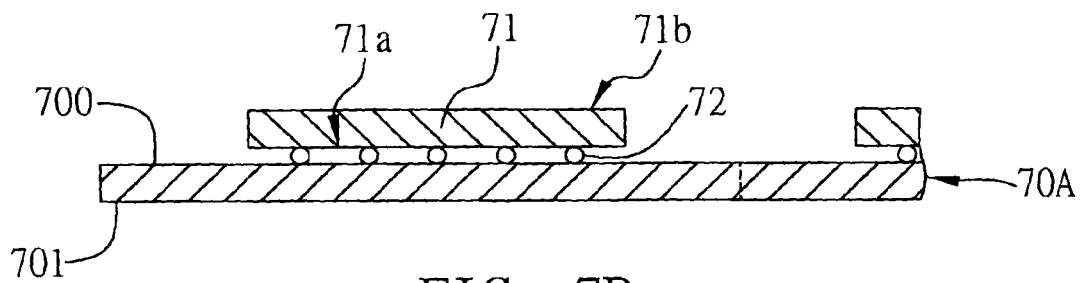

Referring to FIG. 7B, an active surface 71a of a semiconductor chip 71 is mounted and electrically connected to a predetermined position on the upper surface 700 of each of the substrates 70 via conductive bumps 72 in a flip-chip manner. A flip-chip underfilling process can further be performed to fill an underfill material (not shown) between the flip chip 71 and the substrate 70. The flip-chip underfilling process is well known in the art and thus not to be further described herein.

Figure 7C:
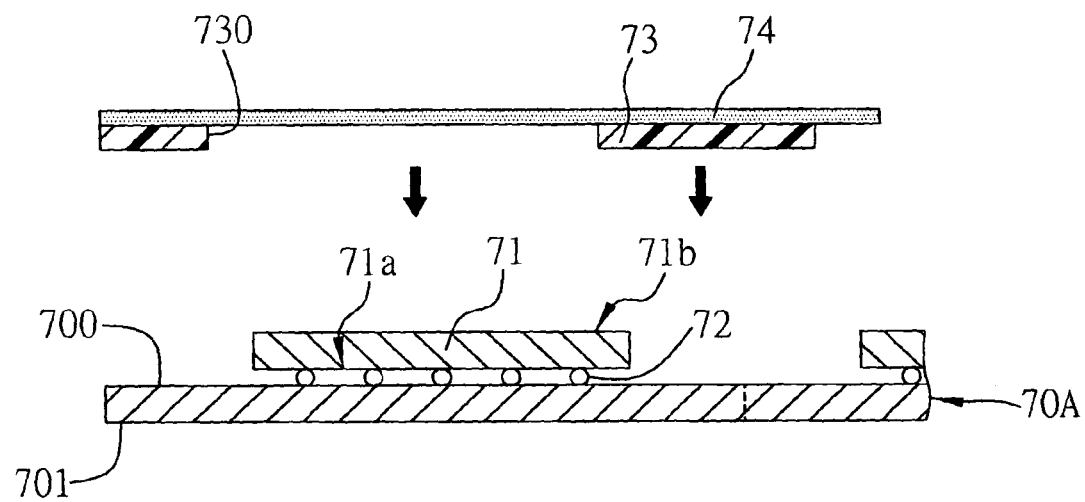

Referring to FIG. 7C, a heat spreader 73 having a hollow portion 730 is attached to an interface layer 74 such as a tape. The hollow portion 730 of the heat spreader 73 corresponds in position to the chip 71 and is larger in size than the chip 71. The heat spreader 73 with the interface layer 74 is mounted to a non-active surface 71b of the chip 71 via the interface layer 74, and the chip 71 is received in the hollow portion 730 of the heat spreader 73, such that the non-active surface 71b of the chip 71 can subsequently be completely exposed to the hollow portion 730. Thereby, thermal resistance from an adhesive layer applied between a chip and a heat spreader as in the conventional technology is avoided, and the chip 71 can directly come into contact the atmosphere to improve the heat dissipating efficiency.

The heat spreader 73 can be made of a metallic material such as copper, aluminum, copper alloy or aluminum alloy, etc., and the hollow portion 730 thereof can have a flexible shape as long as the chip 71 can be received therein. The heat spreader 73 should have a size sufficient to completely cover the substrates 70 mounted with the chips 71. In other words, peripheral edges of the heat spreader 73 should be extended out of peripheral sides 703 of the substrates 70 (as indicated by dotted lines shown in FIG. 7A).

The interface layer 74 can be made of a P.I tape, a metallic material film (such as copper, aluminum), a highly thermal resistant organic material film (such as FR4, BT), or a highly thermal resistant paper film. Adhesion between the interface layer 74 and an encapsulant for encapsulating the chip 71 should be larger than adhesion between the heat spreader 73 and the interface layer 74 or between the non-active surface 71b of the chip 71 and the interface layer 74, and the adhesion between the interface layer 74 and the heat spreader 73 is smaller than adhesion between the heat spreader 73 and the encapsulant 77.

Figure 7D:
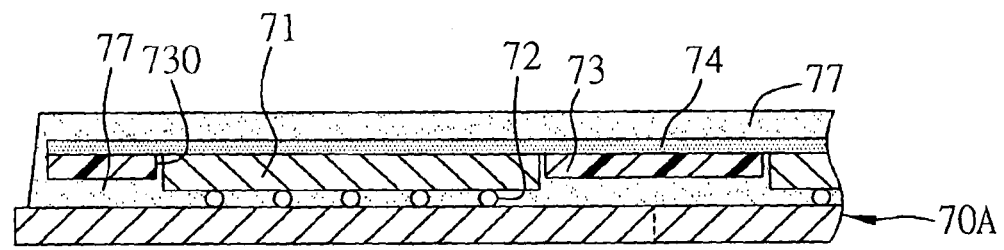

Referring to FIG. 7D, a combined structure of the interface layer 74, the heat spreader 73 having the hollow portion 730, the chips 71 and the substrate module plate 70A is placed into a mold cavity of an encapsulation mold (not shown) to perform a molding process, such that an encapsulant 77 is formed for encapsulating the heat spreader 73 with the interface layer 74, the chips 71 and the conductive bumps 72. As the combined structure has a height allowing an appropriate distance to be formed between the interface layer 74 on the heat spreader 73 and a top wall of the mold cavity, the chip 71 would not be pressed by the encapsulation mold or the heat spreader 73 after engagement of the encapsulation mold, such that chip cracking is avoided. There is no need to have accurate control in height for mounting the heat spreader 73 to the chip 71, thereby effectively improving the yields and reliability of fabricated products.

Figure 7E:
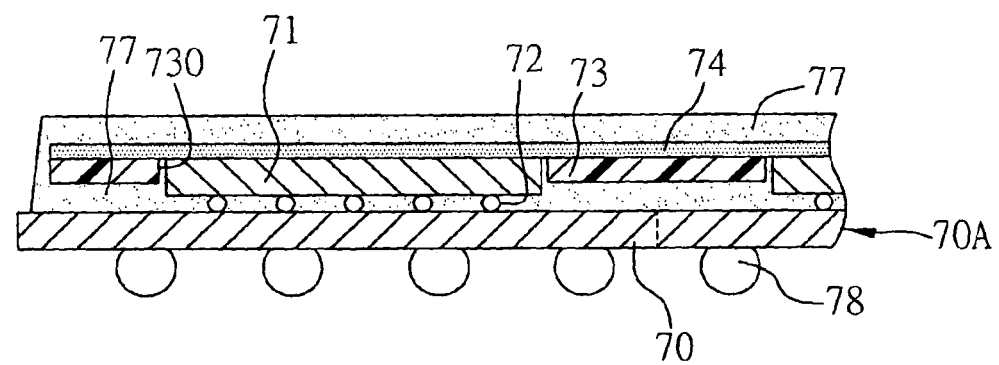

Referring to FIG. 7E, a plurality of conductive elements such as solder balls 78 are implanted on the lower surface 701 of each of the substrates 70 of the substrate module plate 70A, such that the chip 71 can be electrically connected to an external device by the solder balls 78. The ball-implanting process is well known in the art and thus not to be further described herein. Alternatively, the conductive elements such as the solder balls 78 can be implanted after completing a subsequent singulation process of the substrates.

Figure 7F:
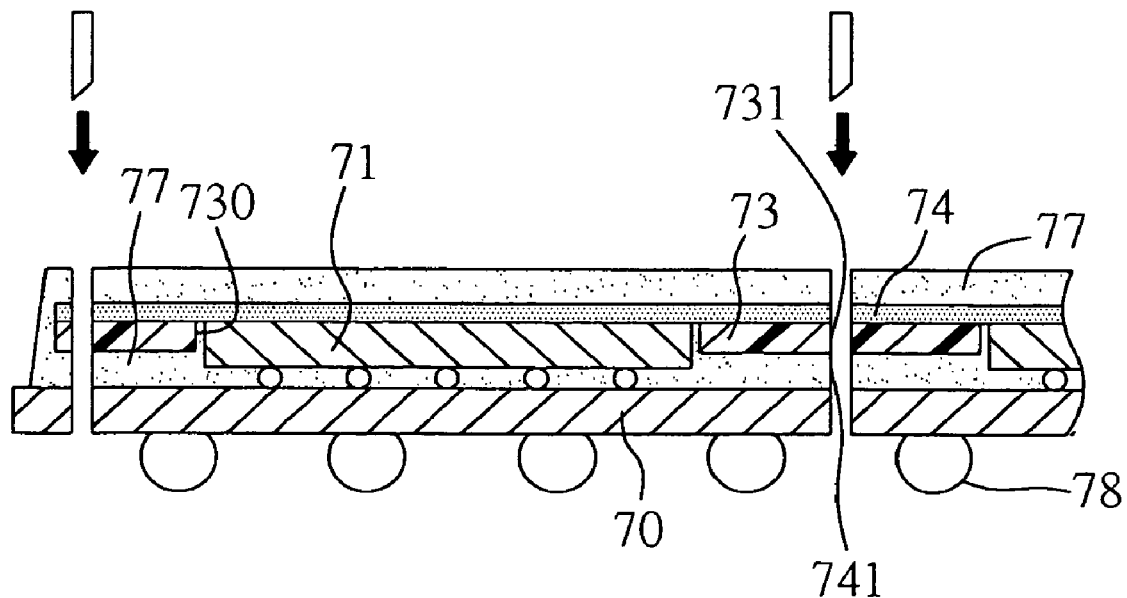

Referring to FIG. 7F, a singulation process is performed using a jig (not shown) to adsorb in vacuum the encapsulant 77 formed on the interface layer 74 of the semi-fabricated product obtained after the ball-implanting process, such that the semi-fabricated product can be adsorbed on the jig during or after the singulation process. As the encapsulant 77 formed on the interface layer 74 is attached to the heat spreader 73 via the interface layer 74, the encapsulant 77 is not detached from the rest part of the semi-fabricated product when performing the singulation process.

After the singulation process, sides 731 of the heat spreader 73 are exposed from the encapsulant 77 and are flush with sides 741 of the encapsulant 77, such that no flash occurs on the sides 731 of the heat spreader 73, and the heat spreader 73 has the same area as that of the substrate 70, without having to precisely size the heat spreader 73 to correspond to a size of the mold cavity of the encapsulation mold. Moreover, the process of mounting the heat spreader 73 to the chip 71 is performed in a batch-type manner, thereby simplifying the fabrication processes and reducing the fabrication time and costs.

Figure 7G:
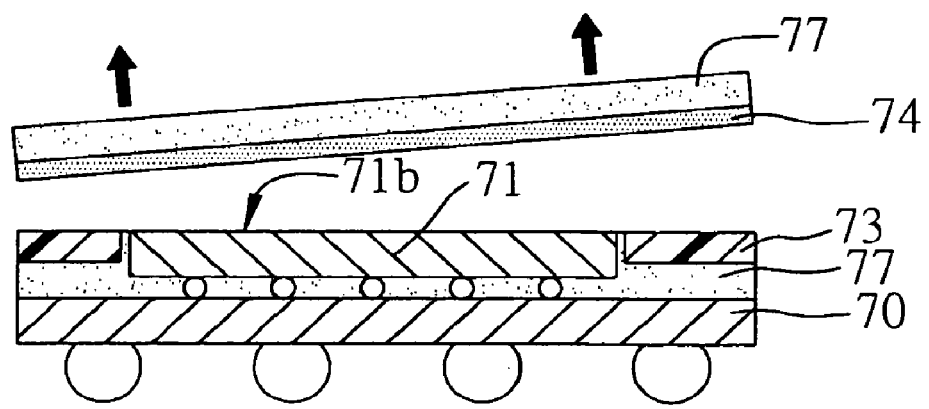

Referring to FIG. 7G, the interface layer 74 and a part of the encapsulant 77 formed thereon are removed from the semi-fabricated product obtained after the singulation process. Since the adhesion between the interface layer 74 and the heat spreader 73/the non-active surface 71b of the chip 71 is smaller than the adhesion between the interface layer 74 and the encapsulant 77 formed thereon, the interface layer 74 can be removed from the heat spreader 73 together with removal of the encapsulant 77 formed on the interface layer 74. Moreover, since the adhesion between the heat spreader 73 and the encapsulant 77 is larger than the adhesion between the interface layer 74 and the heat spreader 73, attachment between the heat spreader 73 and the encapsulant 77 is not affected and no residue of the interface layer 74 is left on the heat spreader 73 and the encapsulant 77 when the interface layer 74 is removed from the heat spreader 73. Thereby, the heat spreader 73 can be exposed from the encapsulant 77 to directly come into contact with the atmosphere, and the non-active surface 71b of the chip 71 can be completely exposed to the hollow portion 730 of the heat spreader 73, such that thermal resistance from an adhesive layer applied between a chip and a heat spreader as in the conventional technology is avoided, and the chip 71 can directly come into contact with the atmosphere to improve the heat dissipating efficiency. Further, there is no need to perform any post treatment for deflashing and residue removal, thereby reducing the packaging costs and ensuring good appearance of fabricated semiconductor packages. As the chip 71 is received in the hollow portion 730 of the heat spreader 73, the package structure can further be made more compact in profile.

Figure 8A:
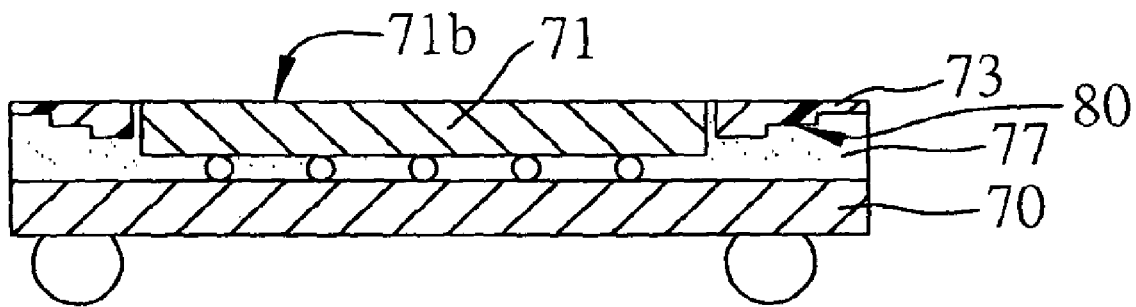
FIG. 8A is a cross-sectional view showing the heat dissipating package structure with enhanced bonding between a heat spreader and an encapsulant according to the second preferred embodiment of the present invention.
Figure 8B:
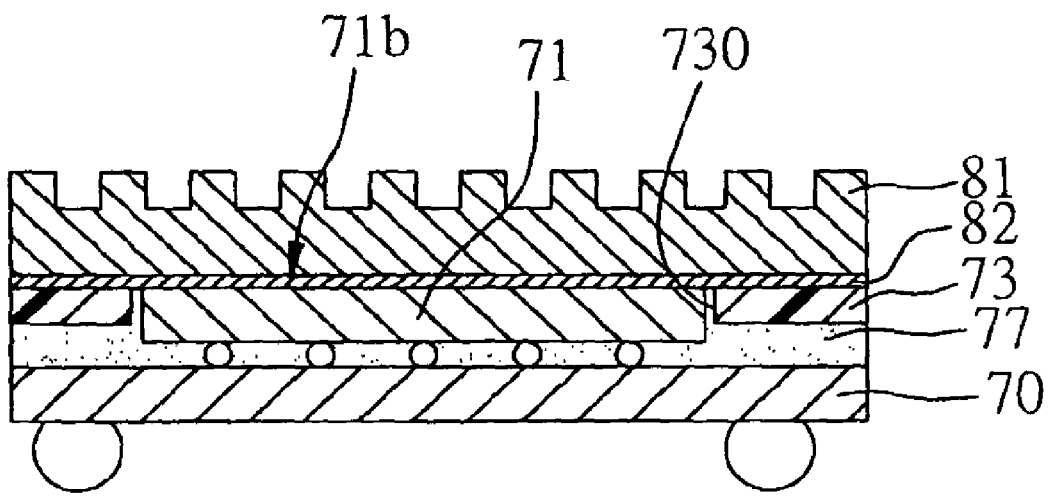
FIG. 8B is a cross-sectional view showing a heat dissipating structure being provided on the heat spreader in the heat dissipating package structure according to the second preferred embodiment of the present invention.

Referring to FIG. 8A, in order to reinforce bonding between the heat spreader 73 and the encapsulant 77, a surface 80 of the heat spreader 73 in contact with the encapsulant 77 can be made uneven or subjected to a black oxidation treatment. Moreover, a heat dissipating structure 81 (as shown in FIG. 8B) can be attached to the heat spreader 73 via a thermally conductive adhesive layer 82 and is extended to reach the non-active surface 71b of the chip 71 exposed to the hollow portion 730 of the heat spreader 73, such that heat generated by the chip 71 during operation can be dissipated by the heat dissipating structure 81.

Third Preferred Embodiment

Figure 9A:
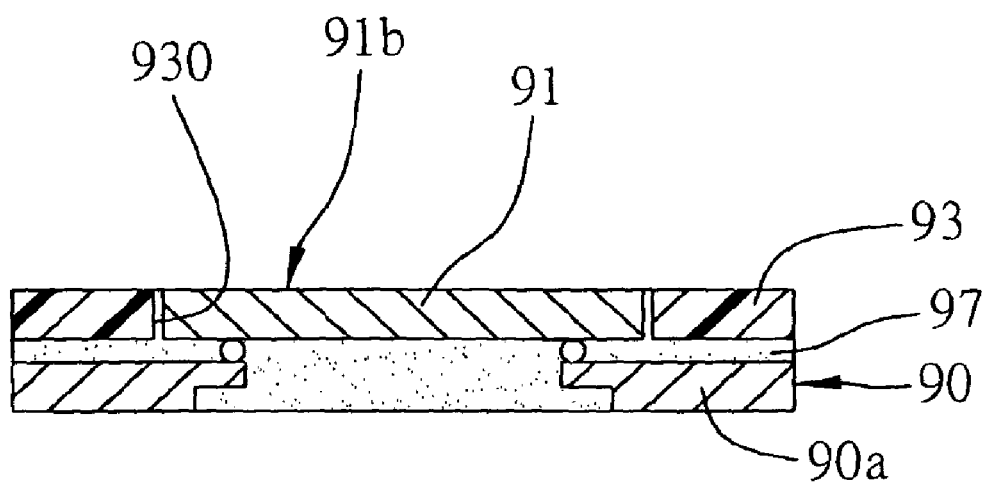
FIGS. 9A and 9B are schematic diagrams showing a heat dissipating package structure according to a third preferred embodiment of the present invention.

FIG. 9A is a cross-sectional view showing a heat dissipating package structure according to a third preferred embodiment of the present invention. The heat dissipating package structure of the third embodiment is fabricated by a method similar to the fabrication methods in the first and second embodiments, with differences in that in the third embodiment, a QFN lead frame 90 is used as a chip carrier for a semiconductor chip 91, wherein the chip 91 is mounted and electrically connected to leads 90a of the QFN lead frame 90 in a flip-chip manner such that the chip 91 can subsequently be electrically connected to an external device by the leads 90a, and the chip 91 is received in a hollow portion 930 of a heat spreader 93. As the chip 91 is smaller in size than the hollow portion 930, a non-active surface 91b of the chip 91 can be completely exposed to the hollow portion 930 of the heat spreader 93. An encapsulant 97 for encapsulating the chip 91 is formed between the heat spreader 93 and the QFN lead frame 90, wherein a bottom surface and sides of the leads 90a are exposed from the encapsulant 97, and sides of the heat spreader 93 are exposed from the encapsulant 97 and are flush with sides of the encapsulant 97.

Figure 9B:
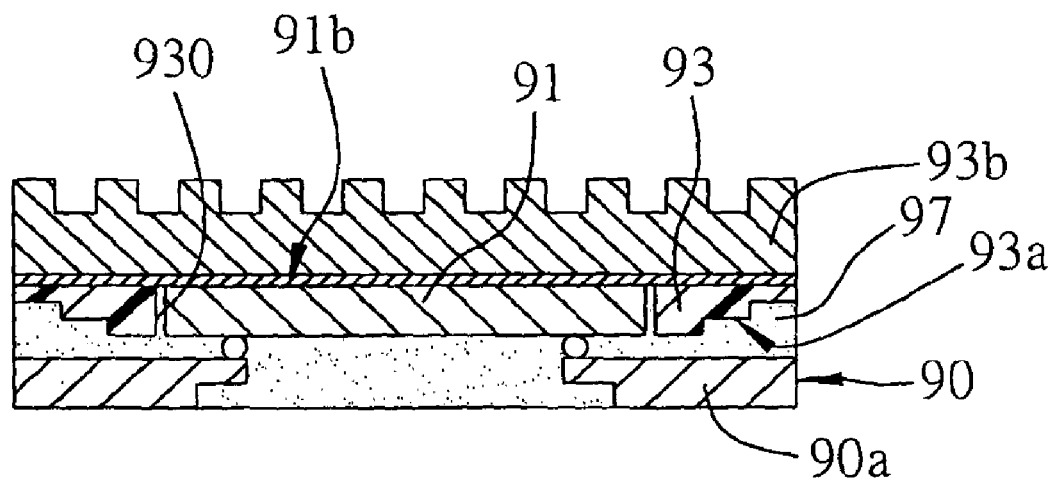

Referring to FIG. 9B, a surface 93a of the heat spreader 93 in contact with the encapsulant 97 can be made uneven or subjected to a black oxidation treatment, so as to reinforce bonding between the heat spreader 93 and the encapsulant 97. Moreover, a heat dissipating structure 93b can be attached to the heat spreader 93 via a thermally conductive adhesive layer and is extended to reach the non-active surface 91b of the chip 91 exposed to the hollow portion 930 of the heat spreader 93, such that heat generated by the chip 91 during operation can be dissipated by the heat dissipating structure 93b.

Therefore, by the heat dissipating package structure and the method for fabricating the same in the present invention, an active surface of a semiconductor chip is mounted and electrically connected to a chip carrier, and a heat spreader having a hollow portion and attached to an interface layer is prepared wherein the interface layer seals one end of the hollow portion of the heat spreader, such that the heat spreader is mounted to a non-active surface of the chip via the interface layer, and the chip smaller in size than the hollow portion of the heat spreader is received in the hollow portion, allowing the non-active surface of the chip to be completely exposed to the hollow portion. By this arrangement, thermal resistance from an adhesive layer applied between a chip and a heat spreader as in the conventional technology is avoided. In the present invention, the chip may directly come into contact with the atmosphere to thereby improve the heat dissipating efficiency. A molding process is then performed to form an encapsulant for completely encapsulating the chip on the chip carrier and the heat spreader with the interface layer. A singulation process is carried out to remove peripheral non-electrical functional portions of a package unit obtained after the molding process. Subsequently, a part of the encapsulant formed on the heat spreader is removed. As the interface layer has larger adhesion with the encapsulant than with the heat spreader or the non-active surface of the chip, the interface layer can be removed together with removal of the part of the encapsulant on the interface layer, without leaving any residue of the interface layer on the heat spreader and the non-active surface of the chip. Therefore, the heat spreader is exposed directly and the non-active surface of the chip is exposed to the hollow portion of the heat spreader, such that the heat dissipating efficiency is improved. Moreover, the present invention can be accomplished by a batch-type manner, which desirably simplifies the fabrication processes, reduces the packaging time and costs, prevents chip cracking or flashes in the molding process and impaired appearance of fabricated products or increase in deflashing costs, and has no concern for height control during the process of mounting the heat spreader to the chip. As such, packaging costs are reduced and yields are improved in the present invention.

The present invention has been described using exemplary preferred embodiments. However, it is to be understood that the scope of the invention is not limited to the disclosed embodiments. On the contrary, it is intended to cover various modifications and similar arrangements, for example, the selection of chip carrier and the manner of electrical connection between semiconductor chip and chip carrier can be flexibly arranged and modified. The scope of the claims, therefore, should be accorded the broadest interpretation so as to encompass all such modifications and similar arrangements.

What is claimed is:

1. A method for fabricating a heat dissipating package structure, comprising the steps of:

mounting a semiconductor chip on at least one chip carrier and electrically connecting an active surface of the semiconductor chip to the chip carrier;

attaching a heat spreader having a hollow portion to an interface layer, wherein the hollow portion corresponds in position to the chip and is larger in size than the chip;

mounting the heat spreader to a non-active surface of the chip via the interface layer, wherein the chip is received in the hollow portion of the heat spreader, and the non-active surface of the chip is flush with a top surface of the heat spreader;

performing a molding process to form an encapsulant for encapsulating the chip on the chip carrier and the heat spreader with the interface layer;

performing a singulation process to remove peripheral non-electrical functional portions of a packaging unit obtained after the molding process, such that sides of the heat spreader are exposed; and removing the interface layer and a part of the encapsulant formed on the interface layer, such that the heat spreader is exposed and the non-active surface of the chip is completely exposed to the hollow portion of the heat spreader so that the non-active surface of the chip comes into contact with atmosphere.

2. The method of claim 1, wherein adhesion between the interface layer and the encapsulant is larger than that between the interface layer and the heat spreader or the non-active surface of the chip, and the adhesion between the interface layer and the heat spreader is smaller than that between the heat spreader and the encapsulant.

3. The method of claim 1, wherein the interface layer is made of one of a polyimide tape, a metallic material film, a highly thermal resistant organic material film, and a highly thermal resistant paper film.

4. The method of claim 1, wherein adhesion between the interface layer and the heat spreader is sufficient to prevent separation between the heat spreader and the interface layer during the singulation process.

5. The method of claim 1, wherein the chip carrier is a substrate or a lead frame, and the at least one chip carrier comprises an array of chip carriers, a strip of chip carriers or at least one single chip carrier.

6. The method of claim 1, wherein the chip is electrically connected to the chip carrier by a wire-bonding or flip-chip technique.

7. The method of claim 1, wherein a surface of the heat spreader in contact with the encapsulant is made uneven or subjected to a black oxidation treatment.

8. The method of claim 1, wherein the sides of the heat spreader are exposed from the encapsulant and are flush with sides of the encapsulant after the singulation process.

9. The method of claim 1, further comprising a step of attaching a heat dissipating structure to the heat spreader via a thermally conductive adhesive layer, wherein the heat dissipating structure is extended to reach the non-active surface of the chip exposed to the hollow portion of the heat spreader.

10. The method of claim 1, wherein a plurality of conductive elements are formed on a surface of the chip carrier free of mounting the chip, so as to electrically connect the chip to an external device via the conductive elements.

11. A method for fabricating a heat dissipating package structure, comprising the steps of:

providing a matrix-type chip carrier module plate comprising a plurality of array-arranged chip carriers;

mounting at least one chip at a predetermined position on each of the chip carriers, and electrically connecting the chip to each of the chip carriers;

attaching a heat spreader having a hollow portion to an interface layer, and mounting the heat spreader to a non-active surface of the chip via the interface layer, wherein the hollow portion is larger in size than the chip, and the chip is received in the hollow portion of the heat spreader, and the non-active surface of the chip is flush with a top surface of the heat spreader;

forming an encapsulant for encapsulating the heat spreader with the interface layer and the chip on each of the chip carriers;

performing a singulation process to form individual semi-fabricated semiconductor packages; and removing the interface layer and a part of the encapsulant formed on the interface layer, such that the heat spreader is exposed, and the non-active surface of the chip is completely exposed to the hollow portion of the heat spreader so that the non-active surface of the chip comes into contact with atmosphere.

12. The method of claim 11, wherein adhesion between the interface layer and the encapsulant is larger than that between the interface layer and the heat spreader or the non-active surface of the chip, and the adhesion between the interface layer and the heat spreader is smaller than that between the heat spreader and the encapsulant.

13. The method of claim 11, wherein the heat spreader has an area sufficient to completely cover the chip carriers of the chip carrier module plate.

* * * * *